United States Patent [19]

Hayashi et al.

[11] Patent Number: 4,900,396
[45] Date of Patent: Feb. 13, 1990

[54] METHOD OF FORMING MODIFIED LAYER AND PATTERN

[75] Inventors: Yutaka Hayashi; Kenichi Ishii, both of Ibaraki; Shunsuke Fujita, Kanagawa, all of Japan

[73] Assignees: Agency of Industrial Science and Technology, Ibaraki; Ricoh Company, Ltd., Tokyo, both of Japan

[21] Appl. No.: 233,585

[22] Filed: Aug. 18, 1988

[30] Foreign Application Priority Data

Aug. 19, 1987 [JP] Japan ................................. 62-205836
Aug. 19, 1987 [JP] Japan ................................. 62-205837
Aug. 3, 1988 [JP] Japan ................................. 63-193740

[51] Int. Cl.$^4$ .................. B44C 1/22; C03C 15/00; C03C 25/06; H01L 21/306
[52] U.S. Cl. .................................. 156/651; 156/653; 156/657; 156/628; 427/264; 427/271; 427/399; 437/228; 437/242; 437/244
[58] Field of Search ............... 156/651, 653, 656, 657, 156/659.1, 662, 628; 427/264, 271, 399; 437/228, 237, 239, 242, 244

[56] References Cited

U.S. PATENT DOCUMENTS

| 3,652,324 | 3/1972 | Chu et al. | 437/244 X |
| 4,113,515 | 9/1978 | Kooi et al. | 437/244 X |
| 4,353,936 | 10/1982 | Nozaki et al. | 437/244 |
| 4,551,910 | 11/1985 | Patterson | 437/242 X |

Primary Examiner—William A. Powell
Attorney, Agent, or Firm—Cooper & Dunham

[57] ABSTRACT

A two-dimensional pattern of a silicon oxide film is formed on a silicon surface of a substrate, thereby to form a material, the two-dimensional pattern being represented by the presence and absence and/or thickness variations of the silicon oxide film. The material is nitrided to form a modified layer on the surface of the material, the modified layer being thicker on the silicon oxide film and thinner on the silicon surface of the substrate or thicker on the thicker portion of the silicon oxide film and thinner on the thinner portion of the silicon oxide film. The thinner portion of the modified layer is removed while leaving the thicker portion of the modified layer, for thereby forming the modified layer on the silicon oxide film substantially in the same shape as the silicon oxide film. An oxidant diffusion prevention film is formed at least on a thicker portion of the oxide film which has a thicker portion and a thinner portion on a substrate, then a silicon film, a silicide film, or a multilayer film composed of silicon and silicide films is deposited on a surface of the substrate a mask layer is formed on the film or films. The silicon film, the silicide film, or the multilayer film is oxidized to pattern the same in a shape corresponding to the mask layer. A relatively thin silicon oxide film may be formed on the oxidant diffusion prevention film.

9 Claims, 11 Drawing Sheets

(A)

(B)

(C)

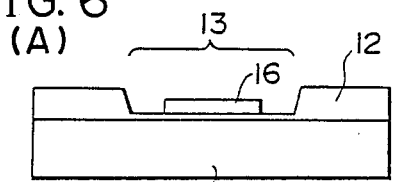
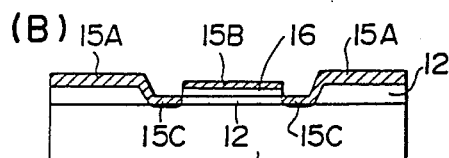
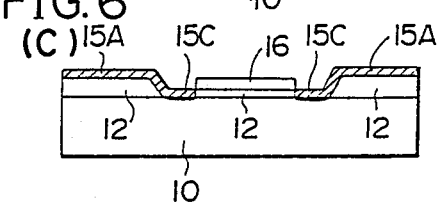
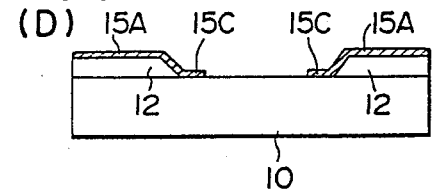
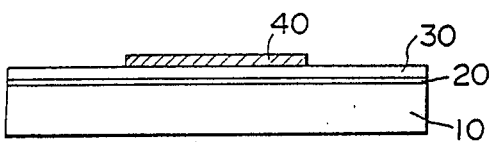
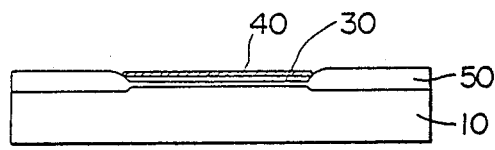
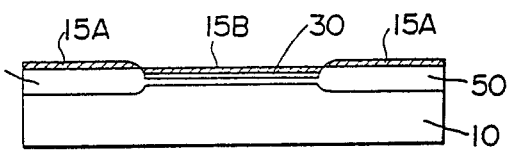
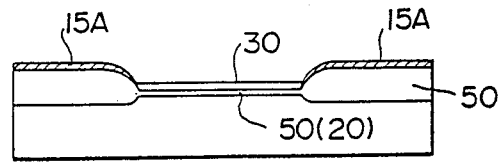

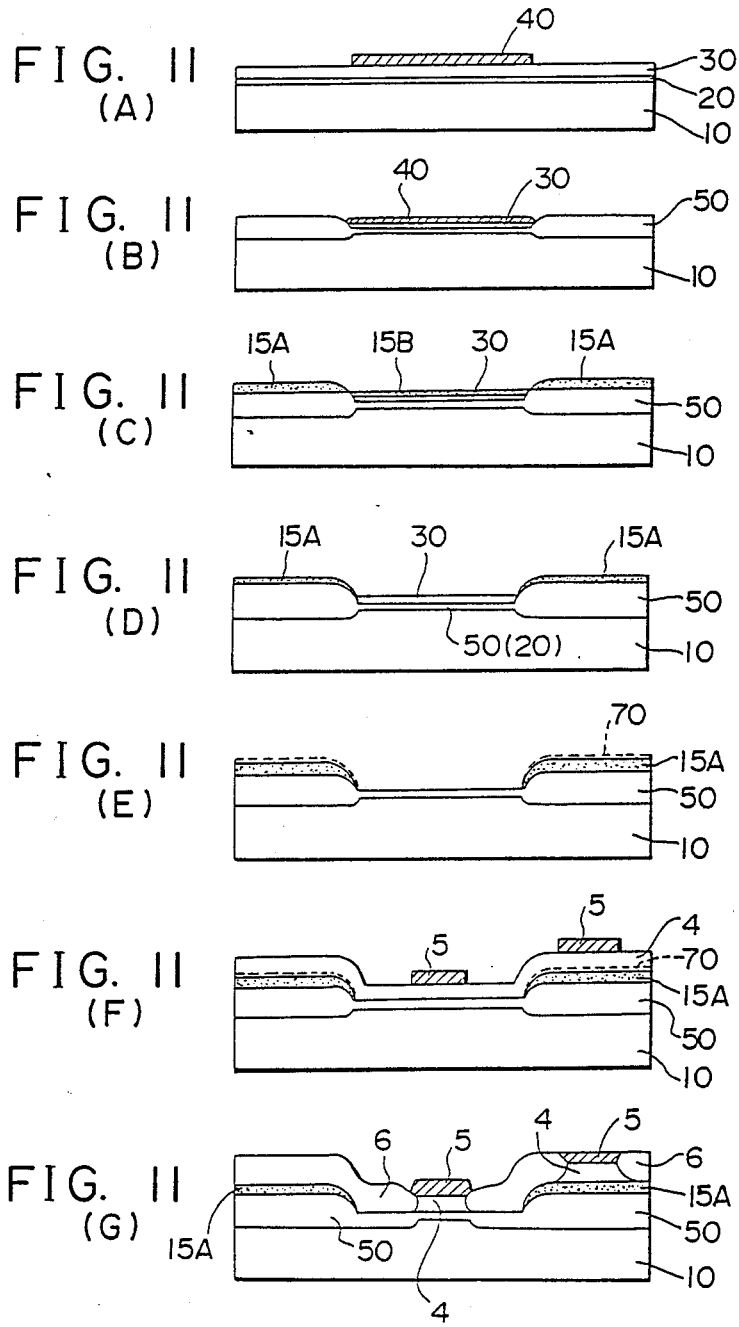

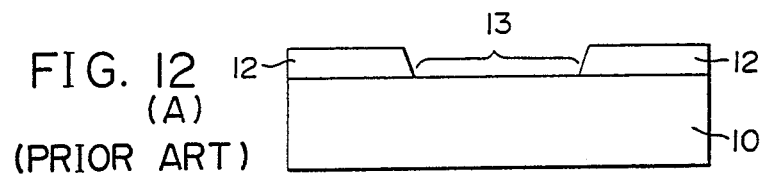
FIG. 12 (A) (PRIOR ART)
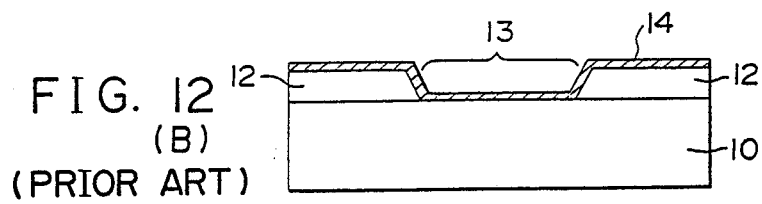
FIG. 12 (B) (PRIOR ART)
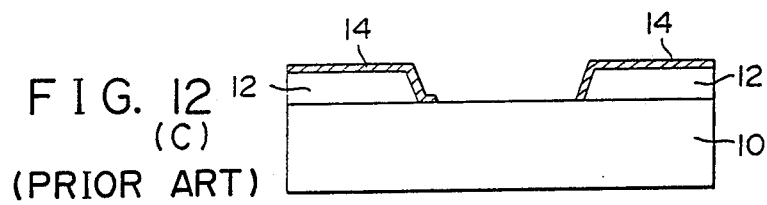
FIG. 12 (C) (PRIOR ART)
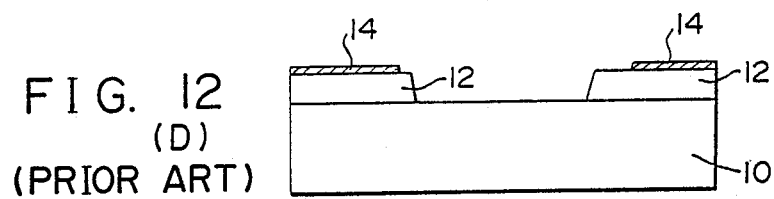
FIG. 12 (D) (PRIOR ART)
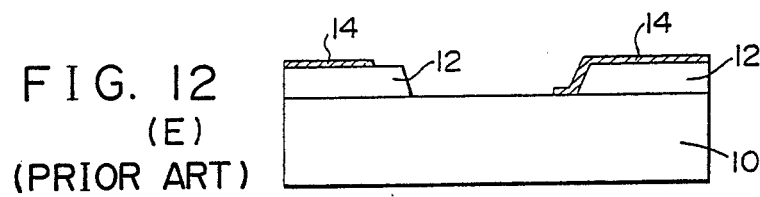
FIG. 12 (E) (PRIOR ART)

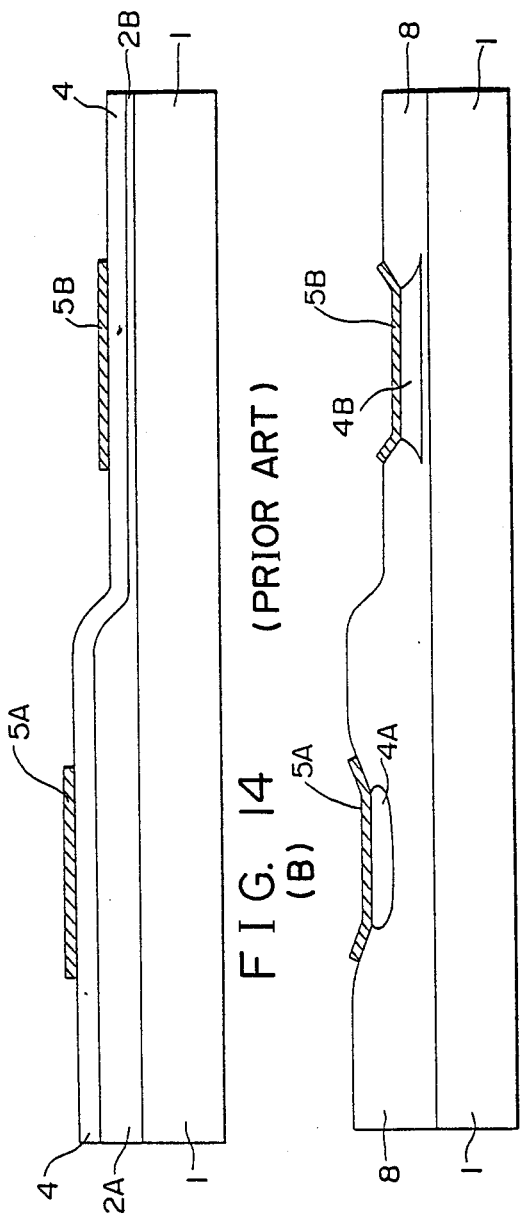
FIG. 14 (A) (PRIOR ART)
FIG. 14 (B) (PRIOR ART)

METHOD OF FORMING MODIFIED LAYER AND PATTERN

BACKGROUND OF THE INVENTION

The present invention relates to a method of forming a modified layer and a pattern.

Formation of modified layers and patterning are required in processes of manufacturing semiconductors and semiconductor devices such as ICs, LSIs, etc.

One silicon semiconductor device structure comprises a substrate having a silicon surface, a desired two-dimensional pattern formed as a silicon oxide film on the substrate, and a modified layer formed by nitriding on the silicon oxide film in substantially the same shape as the silicon oxide film. It has been recognized by the inventors that such a silicon semiconductor device structure is highly effective in the manufacture of various silicon semiconductor devices such as transistors, light detectors, memories, and the like.

The term "substrate" used herein means a substrate made of bulk silicon, a substrate of bulk silicon having an insulation layer or the like and a thin silicon film on the insulation layer, and a substrate comprising a base of, sapphire, quartz or the like and a silicon layer formed thereon. A surface of a substrate on which a two-dimensional pattern will be formed as a silicon oxide film is referred to as a silicon surface which is made of silicon.

Heretofore, a modified layer is formed in a silicon semiconductor device structure of the type described as shown in FIGS. 12(A) through 12(E) of the accompanying drawings.

In FIG. 12(A), a substrate 10 which comprises a silicon substrate by way of example has an upper silicon surface on which a silicon oxide film 12 is formed in a desired two-dimensional pattern up to a prescribed thickness that normally ranges from 0.1 to 1 μm. The two-dimensional pattern has a shape determined dependent on the type and design of a semiconductor device to be manufactured. The upper silicon surface of the substrate 10 has an area 13 free of the two-dimensional pattern, and no silicon oxide film is formed on the area 13 or a silicon oxide film having a thickness ranging from several tens to several hundreds Å. Thus, the silicon surface of the substrate 10 is exposed or covered with a thin silicon oxide film. The two-dimensional pattern is therefore formed as a relief on the silicon surface by the silicon oxide film.

The structure shown in FIG. 12(A) in which the desired two-dimensional pattern is formed as a relief on the substrate by the silicon oxide film is referred to as a material for fabricating a silicon semiconductor device structure.

Then, as shown in FIG. 12(B), a nitride film 14 is deposited o the entire side of the material where the silicon oxide film 12 is formed by CVD employing thermal energy, light energy, plasma, or the like.

Thereafter, the nitride film 4 is removed from the area 13 so that the nitrided film remains only on the two-dimensional pattern.

The above fabrication process has disadvantages as follows: While the nitride film is selectively removed by patterning technology such as photolithography or the like, it is difficult to align the shape of the nitride film with the shape of the silicon oxide film because of limited positioning accuracy and dimensional accuracy upon pattern formation. Consequently, the nitride film 14 and the silicon oxide film 13 tend to be misaligned in shape as shown in FIGS. 12(C), 12(D), and 12(E), for example. As a result, the process has a poor yield in manufacturing semiconductor devices using such silicon semiconductor device structures.

Pattern formation by selective oxidation of a silicon film, a silicide film, or a multilayer film composed of a silicon film and a silicide film will be described below. For selectively oxidizing a silicon film, a silicide film, or a multilayer film composed of a silicon film and a silicide film to form at least a surface of the film as a desired shape, a nitride film or a nitride film deposited on an oxide film is formed as a mask layer on the silicon film, the silicide film, or the multilayer film, and then the mask layer is etched or otherwise patterned into a desired mask shape. Thereafter, the structure is oxidized by being placed in an oxygen or water vapor atmosphere at a high temperature to oxidize those areas of the silicon film, the silicide film, or the multilayer film which are exposed, i.e., are not covered with the mask layer, thus leaving the silicon film, the silicide film, or the multilayer film in the shape of the mask layer under the mask layer.

More specifically, as shown in FIG. 13(A), a relatively thick oxide film 2 is formed on a substrate 1, and a film 4 such as a silicon film, a silicide film, or a multilayer film composed of a silicon film and a silicide film is formed on the oxide film 2. A mask layer 5 which is patterned into a desired shape is deposited on the film 4.

Then, the structure is oxidized to leave the film 4 in the shape of the mask layer 5 under the mask layer 5. Actually, however, as shown in FIG. 13(B), the shape of the film 4 which remains non-oxidized but is left under the mask layer 5 is made much smaller than the mask layer 5. Denoted at 8 is a film which is formed by the films 2 and 4 that are combined together by oxidation.

Where the film 4 is formed on the relatively thick oxide film 2, therefore, the film 4 which is left upon oxidation under the mask layer 5 is much smaller in size than the mask layer 5. In extreme instances, the film 4 beneath the mask layer 5 at narrow portions thereof may be fully oxidized and may not be left under the mask layer 4.

In FIG. 14(A), an oxide film on a substrate 1 includes a thick portion 2A and a thin portion 2B. When the structure is oxidized, as illustrated in FIG. 14(B), a film 4 such as a silicon film, a silicide film, or a multilayer film composed of a silicon film and a silicide film which is left non-oxidized as films 4A, 4B under respective mask layers 5A, 5B. The film 4A on the thick portion 2A of the oxide film is much smaller than the mask layer 5A, whereas the film 4B on the thin portion 2B that is sufficiently thinner than the film 4 is of substantially the same size and shape as the mask layer 5B.

If the oxide film on the substrate has thickness irregularities or thick and thinner portions, as described above, the effect of selective oxidation varies between such thick and thinner portions. Inasmuch as the size of a silicon film, a silicide film, or a multilayer film composed of silicon and silicide films, which is left under a mask layer after oxidation, varies in size dependent on the thickness of an oxide film on which the silicon film, the silicide film, or the multilayer film is formed, it is difficult to effect simultaneous patterning on the silicon, silicide, or multilayer film over the thick and thin portions of the oxide film.

SUMMARY OF THE INVENTION

It is therefore an object of the present invention to provide a method of forming a modified layer, which is capable of easily and reliably aligning a silicon oxide film and a nitride film with each other in shape, and of effectively increasing a yield in manufacturing semiconductor devices employing silicon semiconductor device structures.

Another object of the present invention is to provide a method of forming a pattern, which is capable of reliably producing a silicon film, a silicide film, or a multilayer film composed of silicon and silicide films, which is of substantially the same shape and almost the same size as a mask layer, irrespective of the thickness irregularities of an oxide film on which the silicon, silicide, or multilayer film is formed.

According to the present invention, there are proposed six methods of forming a modified layer and three methods of forming a pattern, as described below.

In each of the six methods of forming a modified layer, a two-dimensional pattern of a silicon oxide film is formed on a silicon surface of a substrate, and a modified layer is formed by nitriding the silicon oxide film substantially in the same shape as the silicon oxide film. The modified layer includes portions of different thicknesses on a silicon oxide film and a silicon surface, the portion of the modified layer on the silicons surface being of a smaller thickness than that of the portion of the modified layer on the silicon oxide film. In another case, the modified layer includes portions of different thicknesses on a thick portion and a thin portion of a silicon oxide film, the portion of the modified layer on the thin portion of the silicon oxide film being of a smaller thickness than that of the portion of the modified layer on the thick portion of the silicon film. The thickness of the silicon oxide film at the thin portion is smaller than the thickness of the modified layer formed on the thick portion of the silicon oxide film. These facts have been found by the inventors.

The first method forming a modified layer in a silicon semiconductor device structure comprises: forming a two-dimensional pattern of a silicon oxide film on a silicon surface of a substrate, thereby to form a material, the two-dimensional pattern being represented by the presence and absence of the silicon oxide film; nitriding at least a side of the material with the silicon oxide film thereon to form a modified layer on the silicon oxide film and the silicon surface of the substrate, the modified layer including a thicker portion on the silicon oxide film and a thinner portion on the silicon surface of the substrate; and removing the thinner portion of the modified layer from the silicon surface while leaving the thicker portion of the modified layer on the silicon oxide film, for thereby forming the modified layer on the silicon oxide film substantially in the same shape as the silicon oxide film.

The second method of forming a modified layer in a silicon semiconductor device structure comprises: forming a two-dimensional pattern of a silicon oxide film on a silicon surface of a substrate, thereby to form a material, the two-dimensional pattern being represented by thickness variations of the silicon oxide film; nitriding at least a side of the material with the silicon oxide film thereon to form a modified layer on thicker and thinner portions of the silicon oxide film, the modified layer including a thicker portion on the thicker portion of the silicon oxide film and a thinner portion on the thinner portion of the silicon oxide film; and removing the thinner portion of the modified layer from the thinner portion of the silicon oxide film while leaving the thicker portion of the modified layer on the thicker portion of the silicon oxide film, for thereby forming the modified layer on the silicon oxide film substantially in the same shape as the silicon oxide film.

The third method of forming a modified layer in a silicon semiconductor device structure comprises: forming a two-dimensional pattern of a silicon oxide film on a silicon surface of a substrate, thereby to form a material, the two-dimensional pattern being represented by the presence and absence and/or thickness variations of the silicon oxide film; nitriding at least a side of the material with the silicon oxide film thereon to form a modified layer on the silicon oxide film or a thicker portion of the silicon oxide film and the silicon surface of the substrate or a thinner portion of the silicon oxide film, the modified layer including a thicker portion on the silicon oxide film or the thicker portion of the silicon oxide film and a thinner portion on the silicon surface of the substrate or the thinner portion of the silicon oxide film; removing the thinner portion of the modified layer from the silicon surface or the thinner portion of the silicon oxide film while leaving the thicker portion of the modified layer on the silicon oxide film or the thicker portion of the silicon oxide film, for thereby forming the modified layer on the silicon oxide film substantially in the same shape as the silicon oxide film; oxidizing at least the side to form a silicon oxide film on the exposed silicon surface; and thereafter selectively removing the silicon oxide film.

The fourth method of forming a modified layer in a silicon semiconductor device structure comprises: depositing a silicon film on a material having a two-dimensional pattern of a silicon oxide film formed on a silicon surface of a substrate, the two-dimensional pattern being represented by thickness variations of the silicon oxide film; patterning the silicon film to remove the same at least on a thicker portion of the silicon oxide film; selectively etching away an exposed portion of the thinner portion of the silicon oxide film which is not covered with the silicon film; nitriding at least a side of the material with the silicon oxide film thereon to form a modified layer on the silicon oxide film, the silicon surface of the substrate, and a surface of the deposited and patterned silicon film, the modified layer including a thicker portion on the silicon oxide film and a thinner portion on the silicon surface and the deposited and patterned silicon film; and removing the thinner portion of the modified layer from the silicon surface while leaving the thicker portion of the modified layer on the silicon oxide film, for thereby forming the modified layer on the silicon oxide film substantially in the same shape as the silicon oxide film.

The fifth method of forming a modified layer in a silicon semiconductor device structure comprises: depositing a silicon film on a material including a two-dimensional pattern of a silicon oxide film formed on a silicon surface of a substrate, the two-dimensional pattern being represented by thickness variations of the silicon oxide film; patterning the silicon film to remove the same at least on a thicker portion of the silicon oxide film; nitriding at least a side of the material with the silicon oxide film thereon to form a modified layer on the silicon oxide film and a surface of the silicon film, the modified layer including a thicker portion on the silicon oxide film and a thinner portion on the surface of the silicon film; and removing the thinner portion of the modified layer from the surface of the silicon film while leaving the thicker portion of the modified layer on the silicon oxide film, for thereby forming the modified layer on the silicon oxide film substantially in the sam shape as the silicon oxide film.

In each of the second, third, and fifth methods, the thinner portion of the silicon oxide film is thinner than the portion of the modified layer formed on the silicon oxide film portion which is sufficiently thick.

The sixth method of forming a modified layer in a silicon semiconductor device structure comprises: forming a relatively thin silicon oxide film on a silicon surface of a substrate; forming a silicon film on the relatively thin silicon oxide film; forming a mask layer on the silicon film in a negative pattern of a two-dimensional pattern; oxidizing the silicon film except an area corresponding to a portion or portions of the mask layer to form a relatively thick silicon oxide film; thereafter removing the mask layer; then nitriding the silicon film and the silicon oxide film to form a modified layer including a thicker portion on the silicon oxide film and a thinner portion on the silicon film; and removing the thinner portion of the modified layer while leaving the thicker portion of the modified layer.

In each of the above six methods, a nitride film is formed as a modified layer by nitriding a silicon oxide film. The nitriding process of forming such a modified layer may be a thermal nitriding process in which the silicon oxide film and the silicon surface are nitrided in a nitriding atmosphere of ammonium, nitrogen, or the like at a high temperature, a plasma nitriding process in which the silicon oxide film and the silicon surface are nitrided in an atmosphere containing plasma of ammonium, nitrogen, or the like, a photo-nitriding method in which the silicon oxide film and the silicon surface are nitrided by application of light energy, or any of other known direct nitriding processes, or a combination of these processes.

Each of the above six methods is based on the fact that the thickness of a modified layer formed by nitriding is thicker on silicon oxide and thinner on silicon, and also on the fact that the thickness of a modified layer formed by nitriding is thicker on a thick portion of silicon oxide and thinner on a thin portion of silicon oxide.

Now, the principles of the present invention will be described with reference to FIGS. 1(A) through 1(C). Denoted at 100, 200 are silicon oxide and silicon. Upper surfaces of the silicon oxide 100 and the silicon 200 illustrated in FIG. 1(A) are nitrided by the direct nitriding process, as described above, to form modified layers 100A, 200A as shown in FIG. 1(B). When these modified layers 100A, 200A are formed by nitriding under the same conditions, the modified layer 100A has a thickness d1 of several hundreds Å whereas the modified layer 200A has a thickness d2 of several tens Å. The thickness d2 is about 1/10 of the thickness d1.

Then, the structure of FIG. 1(B) is etched to remove a layer having a thickness d3 (d1>d3>d2) from the side where the modified layers 100A, 200A are present, as shown in FIG. 1(C). The modified layer 200A is completely removed from the silicon 200, leaving a new silicon surface exposed. On the other hand, since the modified layer 100A in the silicon oxide 100 has a sufficient thickness, the modified layer 100A still remains in the silicon oxide 100 even after the etching process.

According to the present invention, the formation of a modified layer is based on this fact.

In each of the three methods of forming a pattern, an oxide film is formed (deposited or grown) on a substrate, and then a silicon film, a silicide film, or a multilayer film composed of silicon and silicide films is deposited on the oxide film. Thereafter, a mask layer of a desired shape is formed on the silicon film, the silicide film, or the multilayer film, which is then oxidized so as to be patterned in a shape corresponding to the mask layer.

The first method of forming a pattern comprises: forming an oxide film on a substrate, the oxide film having thicker and thinner portions; forming an oxidant diffusion prevention film at least on the thicker portion of the oxide film; depositing a silicon film, a silicide film, or a multilayer film composed of silicon and silicide films a furface of the substrate with the oxide film and the oxidant diffusion prevention film; forming a mask layer of a desired shape on the silicon film, the silicide film, or the multilayer film; and oxidizing the silicon film, the silicide film, or the multilayer film to pattern the same in a shape corresponding to the mask layer.

The second method of forming a pattern comprises: forming an oxide film on a substrate, the oxide film having thicker and thinner portions; forming an oxidant diffusion prevention film at least one the thicker portion of the oxide film; depositing a silicon film, a silicide film, or a multilayer film composed of silicon and silicide films on a surface of the substrate with the oxide film and the oxidant diffusion prevention film; forming a mask layer of a desired shape on the silicon film, the silicide film, or the multilayer film; and oxidizing the silicon film, the silicide film, or the multilayer film to pattern the same in a shape corresponding to the mask layer simultaneously on the thicker and thinner portions of the oxide film.

The third method of forming a pattern further comprises the step of forming a relatively thin oxide film on the oxidant diffusion prevention film in the first or second method.

In each of the second and third methods of forming a pattern, the thinner portion of the oxide film is thinner than at least the silicon film, the silicide film, or the multilayer film.

The oxidant diffusion prevention film is preferably a nitride film or an oxi-nitride film, which may be of silicon nitride, silicon oxi-nitride, aluminum nitride, aluminum oxi-nitride, or the like.

The conventional problems described above with reference to FIGS. 13(A), 13(B) and 14(A), 14(B) are summarized as follows: When a silicon film, a silicide film, or a multilayer film composed of silicon and silicide films, with a mask layer disposed thereon, is patterned by being selectively oxidized, the silicon, silicide, or multilayer film is left in substantially the same size and shape as the mask layer on such a portion of an oxide film beneath the silicon, silicide, or multilayer film, which is sufficiently thinner than the silicon, silicide, or multilayer film, but the silicon, silicide, or multilayer film left on a thicker portion of the oxide film is considerably smaller in size and shape than the mask layer thereon.

The inventors have analyzed the aforesaid phenomenon, and found that it is caused by the fact that oxidants are transferred by the oxide film below the silicon, silicide, or multilayer film.

The oxidants are oxygen molecules in a dry oxidizing process, and water molecules or HO base in a water-vapor oxidizing process. Where another gas such as $HCl_2Cl_2$, $CF_4$, $NF_3$, or the like is simultaneously with oxygen or water vapor, the oxidants include a reactive substance such as Cl, F, or the like produced from such a gas. Upon selective oxidation, oxidation progresses from an exposed portion of the silicon film, silicide film, or multilayer film in a direction across the thickness thereof. After oxidation has reached the bottom of the silicon, silicide, or multilayer film, the oxidants are diffused quickly in a portion contacting the base oxide film, and are also transferred along the film surface. Therefore, the oxidants find their way from the peripheral edge of the mask layer into a portion of the silicon, silicide, or multilayer film which is covered with the mask layer, for thereby promoting oxidation of the covered portion of the silicon, silicide, or multilayer film. As a result, the portion of the silicon, silicide, or multilayer film which remains non-oxidized becomes much smaller in size than the mask layer.

The aforesaid drawbacks are liable to occur because oxidizing conditions are selected such that the entire thickness of the silicon, silicide, or multilayer film will be oxidized with a certain additional margin.

The fact that the above phenomenon is brought about by the transfer of oxidants through the oxide film below the silicon, silicide, or multilayer film can also be understood from the following analysis: As shown in FIGS. 14(A) and 14(B), on the thinner portion 2B of the oxide film, the silicon, silicide, or multilayer film which is left as a result of selective oxidation is of substantially the same size and shape as the mask layer 5B. This is considered to arise from the fact that when the oxide film is thinner than would be if the silicon, silicide, or multilayer film 4 were oxidized by the additional marginal oxidizing capability, the amount of oxidants transferred is small, and the oxidation below the mask layer is promoted at a low level.

According to the first and second methods of forming a pattern, the silicon, silicide, or multilayer film is selectively oxidized for patterning with the oxidant diffusion prevention film being interposed between the silicon, silicide, or multilayer film and the oxide film therebeneath.

The nitride film or oxi-nitride film used as the oxidant diffusion prevention film is denser in composition than the oxide film, and hence the diffusion of oxidants in the nitride film or oxide nitride film is slow. Therefore, it is highly unlikely for oxidation of the silicon, silicide, or multilayer film to be promoted along the nitride film or oxi-nitride film as the oxidant diffusion prevention film.

As described above, oxidants are transferred mainly along the thicker portion of the oxide film. Consequently, in the case where an oxide film has thicker and thinner portions, and only the silicon, silicide, or multilayer film and the thicker portion are patterned, or the silicon, silicide, or multilayer film and the thicker and thinner portions are simultaneously patterned, an oxidant diffusion prevention film may be provided only on the thicker portion of the oxide film. For the fabrication of MOSIC/LSI, since no nitride film is provided on the gate insulation film, such an arrangement is employed in many specific applications.

According to the third method of forming a pattern, a relatively thin oxide film is additionally formed on the oxidant diffusion prevention film, as will be described later with reference to its embodiment.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 6(A) through 6(D) are views explaining a method of forming a modified layer according to yet still another embodiment of the present invention;

FIGS. 7(A) through 7(D) are views explaining a method of forming a modified layer according to another embodiment of the present invention;

FIGS. 11(A) through 11(G) are views explaining a method of forming a pattern according to a further embodiment of the present invention;

FIGS. 12(A) through 12(E) are views explanatory of problems experienced with a conventional method of forming a modified layer; and FIGS. 13(A), 13(B) and 14(A), 14(B) are views explanatory of problems with conventional methods of forming a pattern.

DESCRIPTION OF THE PREFERRED EMBODIMENTS

Figure 1:
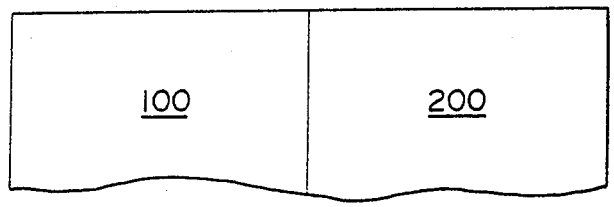
FIGS. 1(A) through 1(C) are views explaining the principles of forming a modified layer.
Figure 1:
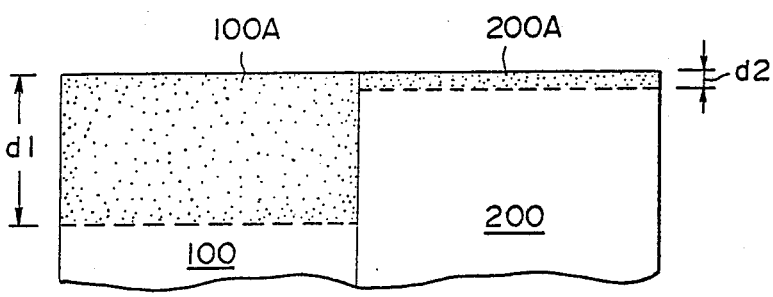
Figure 1:
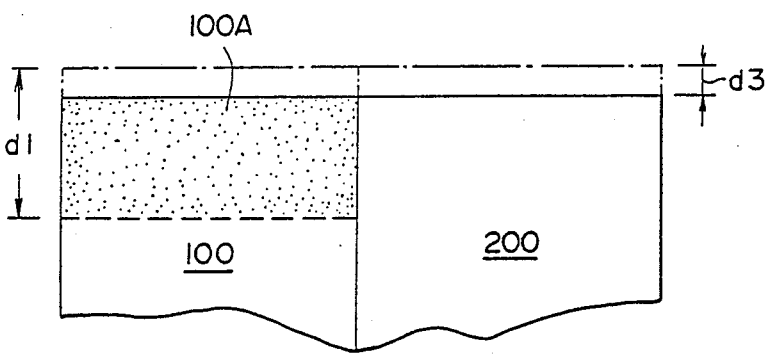
Figure 2:
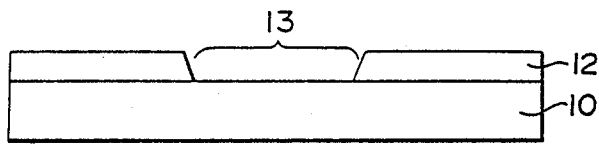
FIGS. 2(A) through 2(C) are views explaining a method of forming a modified layer according to an embodiment of the present invention.
Figure 2:
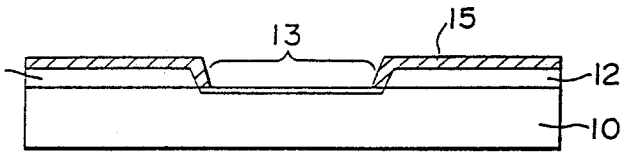
Figure 2:
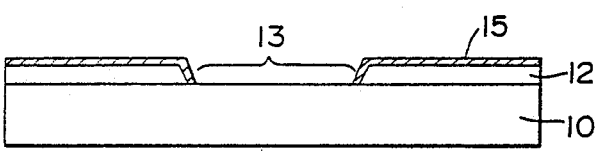

First, methods of forming a modified layer according to six embodiments of the present invention will be described with reference to FIGS. 2 through 7.

In the embodiments shown in FIGS. 2 through 6, the same silicon substrate as that shown in FIGS. 12(A) through 12(E) is employed. In FIGS. 2 through 6, therefore, the silicon substrate is denoted at 10, a silicon oxide film is denoted at 12, and an area other than a two-dimensional pattern formed by the silicon oxide film on a thick portion of the silicon oxide film is denoted at 13.

On a material shown in FIG. 2(A), a two-dimensional pattern is formed on the silicon surface of the silicon substrate 10 as a relief represented by the presence and absence of a silicon oxide film 12, with the silicon surface being exposed in the area 13 free of the two-dimensional pattern.

By then effecting thermal nitriding on the side of the material where the silicon oxide film 12 is formed, a modified layer 15 is formed by nitriding as shown in FIG. 2(B). The modified layer 15 is thicker on the silicon oxide film 12, and thinner in the area 13 because the modified layer 15 is formed on the silicon surface.

Thereafter, the modified layer 15 is gradually etched away by phosphoric acid heated up to about 200° C., for example. Since the modified layer 15 is thicker on the silicon oxide layer 12 and thinner in the area 13, the modified layer 15 is first removed in the area 13 until the silicon surface of the substrate 10 is exposed, whereupon the etching process on the modified layer 15 is stopped. Thus, the modified layer 15 remains only on the silicon oxide film 12 in exact alignment with the pattern of the silicon oxide film 12. Accordingly, the modified layer of desired shape can be formed.

In this embodiment, the period of time in which the modified layer 15 is etched is adjusted in order to remove the thinner modified layer from the silicon surface and leave the thicker modified layer on the silicon oxide film. The method according to this embodiment is one specific example of the first method referred to above.

FIGS. 3(A) through 3(C) show another embodiment of the present invention. As shown in FIG. 3(A), a silicon oxide film 12 is formed on a silicon substrate 10, the silicon oxide film 12 having different thicknesses presented as a relief in a two-dimensional pattern. The silicon oxide film 12 has a thinner portion as an area 13. The silicon oxide film in the area 13 may be a natural oxide film or a thermal oxide film of the silicon surface of the silicon substrate 10.

The material shown in FIG. 3(A) is then nitrided to form a modified layer 15 as shown in FIG. 3(B). At this time, the thickness of the silicon oxide film in the thinner portion of the silicon oxide film 12, i.e., in the area 13, must meet the following conditions: First, the entire silicon oxide film 12 in the area 13 must be nitrided into the modified layer 15. Secondly, the thickness of the silicon oxide film 12 in the area 13 must be sufficiently smaller than the thickness of the modified layer 15 which will be formed on the thicker portion of the silicon oxide film in the two-dimensional pattern. In FIG. 3(B), the modified layer 15 in the area 13 is composed of a nitroded silicon oxide (generally, oxi-nitride) film which the thinner silicon oxide film was modified into, and a silicon nitride film which a portion of the silicon surface of the silicon substrate 10 was modified into.

Thereafter, the modified layer 15 is etched away in the same manner as the previous embodiment shown in FIGS. 2(A) through 2(C) until the modified layer 15 is entirely removed from the area 13 to expose the silicon surface of the silicon substrate 10, whereas the modified layer 15 is left on the silicon oxide film 12 in the two-dimensional pattern. Then, the etching process is stopped to produce a desired modified layer shown in FIG. 3(C). In this embodiment, the very thin modified layer on the silicon substrate surface in the area 13 is removed, slightly recessing the silicon surface below the original surface level as shown in FIG. 3(C). This embodiment is one specific example of the second method referred to above.

Where the thin silicon oxide film is formed in the area 13, any defect which may be produced on the silicon surface by nitriding may be minimized.

A material may include an area 13 at a part of which a silicon surface of a silicon substrate is exposed and the rest of which is covered with a very thin silicon oxide film. A desired modified layer may be formed on such a material in the same manner as the aforesaid embodiments.

Figure 3:
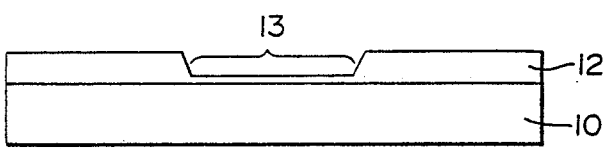
FIGS. 3(A) through 3(C) are views explaining a method of forming a modified layer according to another embodiment of the present invention.
Figure 3:
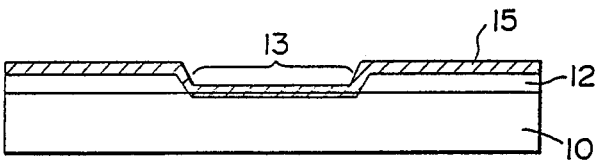
Figure 3:
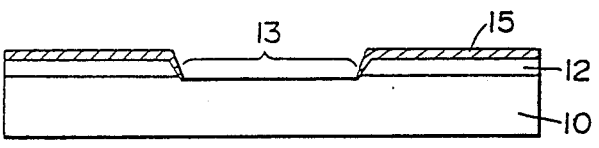
Figure 4:
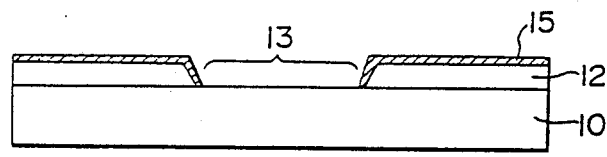
FIGS. 4(A) through 4(C) are views explaining a method of forming a modified layer according to still another embodiment of the present invention.
Figure 4:
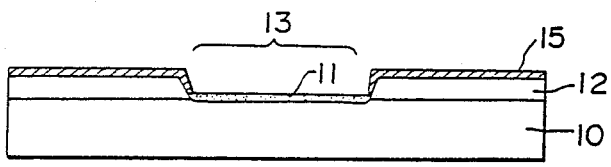
Figure 4:
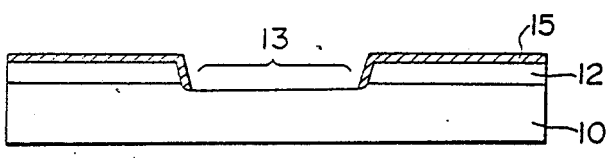
Figure 5:
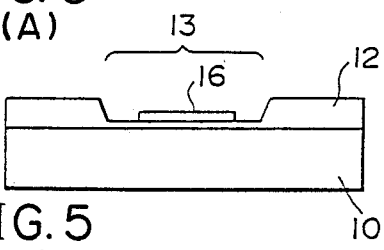
FIGS. 5(A) through 5(D) are views explaining a method of forming a modified layer according to yet another embodiment of the present invention.
Figure 5:
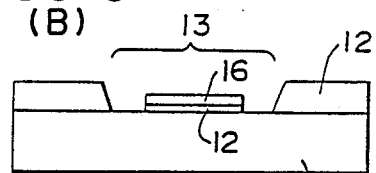
Figure 5:
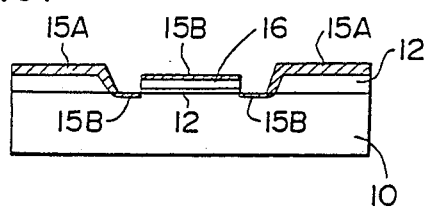
Figure 5:
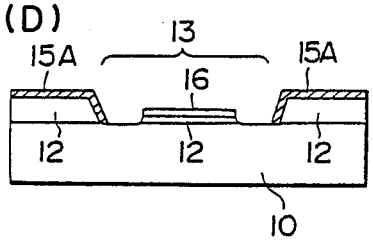

The embodiment shown in FIG. 3 will be described in greater detail. When the material is nitrided in an ammonium atmosphere at a temperature of 1100° C., for example, the modified layer is formed down to a depth of 300 Å in the silicon oxide film, but only to a depth of 50 Å in silicon. Therefore, if the thickness of the silicon oxide film in the area 13 is 250 Å or smaller, then the thickness of the modified layer in the area 13 is smaller than the thickness of the modified layer in the two-dimensional pattern. According to this method, therefore, the modified layer can be removed only from the area 13, whereas the modified layer can be left in other areas, i.e., in the two-dimensional pattern of the thick oxide.

The aforesaid two embodiments are concerned with the first and two methods referred to above. With these methods, however, defects may be produced in the silicon surface of the silicon substrate when the material is nitrided and subsequently the modified layer is removed.

Such a problem can be eliminated by the third method referred to above, as described below.

FIG. 4(A) illustrates a silicon semiconductor device structure which is fabricated by the method shown in FIGS. 2(A) through 2(C) or FIGS. 3(A) through 3(C). Thus, the structure shown in FIG. 4(A) is the same as the structure shown in FIGS. 2(C) or 3(C). Stated otherwise, the steps of the third method which are carried out to produce the structure of FIG. 4(A) are the same as those of the first or second method. According to the third method, furthermore, the structure of FIG. 4(A) is oxidized by thermal oxidation. The oxidation is chiefly effected on the exposed silicon surface, so that a new silicon oxide film 11 grows only on the exposed silicon surface in the area 13 as shown in FIG. 4(B).

Then, the newly formed silicon oxide film 11 is removed by an etchant that can selectively etch the silicon oxide film, such as an etching solution of hydrofluoric acid, buffered hydrofluoric acid, or the like, for thereby producing a desired silicon semiconductor device structure as shown in FIG. 4(C). Removal of the silicon oxide film 11 leaves the silicon surface exposed in the area 13. Although the exposed silicon surface may contain defects when the structure shown in FIG. 4(A) is fabricated, such defects are removed primarily by the silicon oxide film 11, and any deeper defects are cured upon thermal oxidation. Therefore, the silicon semiconductor device structure illustrated in FIG. 4(C) is free of such defects or has only few defects. The thermal oxidation process and the subsequent etching process only slightly affect the modified layer 15 and the silicon oxide film 12 covered with the modified layer 15.

Yet another embodiment which is a specific example of the fourth method referred to above will be described below with reference to FIGS. 5(A) through 5(D).

The fourth method is carried out as follows:

A two-dimensional pattern is formed on the silicon surface of a silicon substrate 10 as a relief represented by different thicknesses of a silicon oxide film 12, and then a film of silicon, e.g., polycrystalline silicon is deposited on the silicon oxide film 12. Thereafter, the silicon film is removed by photolithography so that a removed portion of the silicon film will contain and be slightly wider than the two-dimensional pattern. Accordingly, the deposited silicon film remains only on the thinner portion of the silicon oxide film 12, i.e., in the area 13.

The resultant structure is shown in FIG. 5(A). As a result, the silicon film 16 is left only in the area 13 at a size smaller than the area 13.

Upon removal of the silicon film with photolithography, therefore, it is not necessary that the portion of the silicon film 16 which is to remain be fully aligned with the area 13, but it is only necessary to leave that portion of the silicon film 16 in a size smaller than the area 13. Consequently, the positioning accuracy and dimensional accuracy are not required to be very high during the process of photolithography.

Thereafter, the silicon oxide film 12 is etched by an etching solution of buffered hydrofluoric acid for example, which can selectively dissolve silicon oxide, to remove the exposed portion of the silicon oxide film 12 in the area 13 and in other portions, which is not covered with the silicon film 16, as shown in FIG. 5(B). The silicon surface of the silicon substrate 10 in the area 13 is exposed where the thin silicon oxide film is removed.

Subsequently, the structure is directly nitrided by thermal nitriding or the like to form a modified layer including a thicker portion 15A on the thicker portion of the silicon oxide film 12 and a thinner portion 15B on the silicon surface and the silicon film 16, as shown in FIG. 5(C).

Then, the thin portion 15B of the modified layer is removed while the thick portion 15A thereof is left, by being etched by phosphoric acid at a high temperature to produce a structure shown in FIG. 5(D). If necessary, the silicon film 16 and the thin silicon oxide film 12 left in the area 13 may be removed. While the silicon semiconductor device structure thus obtained is being fabricated, therefore, most part of the area 13 is protected by the thin silicon oxide film and the silicon film 16 interposed thereon, so that defects are effectively prevented from being produced in the silicon surface in the area 13.

An embodiment of the fifth method referred to above will be described with reference to FIGS. 6(A) through 6(D).

The structure shown in FIG. 6(A) is exactly the same as the structure illustrated in FIG. 5(A) In this structure, a two-dimensional pattern is formed on a silicon substrate 10 as a relief represented by thickness variations of a silicon oxide film 12, with an area 13 being partly covered with a silicon film 16.

Then, the structure is nitrided to form a modified layer including a thicker portion 15A on the thicker portion of the silicon oxide film 12, a thinner portion 15B on the silicon film 16, and an intermediate portion 15C in the area 13 except the silicon film 16, the intermediate portion 15C being formed by nitriding the thinner portion of the silicon oxide film 12 and a portion of the silicon surface of the silicon substrate 10. The portions 15A, 15C, 15B of the modified layer are progressively smaller in thickness in the named order.

Then, the modified layer is etched to remove only the thinner portion 15B while leaving the other portions 15A, 15C to produce a structure shown in FIG. 6(C). Then, the silicon oxide film 12 and the silicon film 16 are removed from the area 13 as shown in FIG. 6(D). Since the silicon surface of the silicon substrate 10 which is exposed in FIG. 6(D) has been protected by the silicon oxide film 12 and the silicon film 16 during the fabrication process, defects are prevented from being produced in that silicon surface. The modified layer that has been left includes the portions 15A, 15C. Exact alignment between the shapes of the modified layer and the two-dimensional pattern of the silicon oxide film 12 is slightly lowered because of the portion 15C of the modified layer. However, since the modified layer portion 15C is always present in the boundary between the thicker portion of the silicon oxide film 12 and the exposed silicon surface, macroscopic alignment between them, including the boundary, is rather increased.

An embodiment according to the sixth method will be described with reference to FIGS. 7(A) through 7(D).

On a silicon substrate 10 shown in FIG. 7(A), there are formed a relatively thin silicon oxide film 20, a silicon film 30 of polycrystalline silicon or the like, and a silicon nitride film 40. The silicon nitride film 40 is first uniformly formed on the silicon film 30 over its entire surface, and then patterned as a negative pattern of a desired two-dimensional shape by photolithography. At this time, the silicon film 30 and the silicon oxide film 20 may also be shaped in the same pattern as the silicon nitride film 40.

Then, the structure is oxidized while the silicon nitride film 40 is being used as a mask layer. The portion of the silicon film 30 which is not covered with the mask layer is oxidized and united with the lower silicon oxide film 20, and a portion of the silicon surface of the silicon substrate 10 is also oxidized into silicon oxide. These oxidized portions grow into a silicon oxide film 50 as shown in FIG. 7(B).

Subsequently, the mask layer of silicon nitride film 40 is removed to produce the desired two-dimensional pattern represented by thickness variations of the silicon oxide film 50, with an area free of the two-dimensional pattern being covered with the silicon film 30. Then, the structure is directly nitrided to form a modified layer including a thicker portion 15A on the silicon oxide film 50 and a thinner portion 15B on the silicon film 30, as shown in FIG. 7(C). Thereafter, only the thinner portion 15B of the modified layer is removed while leaving the thicker portion 15A thereof thereby fabricating a silicon semiconductor device structure having a desired modified layer, as shown in FIG. 7(D).

With the arrangement shown in FIG. 7(D), the shape of the modified layer is in exact alignment with the shape of the two-dimensional pattern. The silicon film 30 and the relatively thin silicon oxide film 20 therebelow may of course be removed if necessary. The silicon surface below the relatively thin silicon oxide film 20 is protected by the relatively thin silicon oxide film 20 and the silicon film 30 against formation of defects therein. According to the embodiments shown in FIGS. 5, 6, and 7, the relatively thin silicon oxide films 12, 20 and the silicon films 16, 30 may be partly left for use as gate insulation films and conduction gates of insulated-gate field-effect transistors.

According to the aforesaid methods of forming a modified layer, a nitride layer formed on a silicon oxide film is formed as a modified layer of the silicon oxide film, and, based on the fact that the modified layer has different thicknesses on silicon oxide and silicon, the modified layer is left only on the silicon oxide film. Thus, the remaining modified layer is highly aligned with the two-dimensional pattern represented by the silicon oxide film.

In the embodiments, the modified layer which has been formed by nitriding the silicon oxide film and the silicon surface is removed by a wet etching process which employs hot phosphoric acid or the like. However, the modified layer may selectively be removed by a dry etching process which employs an etching gas that is a mixture of an oxygen gas and {(a Freon gas such as of CF$_4$ or the like) or (NF$_3$ or the like)].

Now, methods of forming a pattern according four embodiments of the present invention will be described below.

Figure 13A:
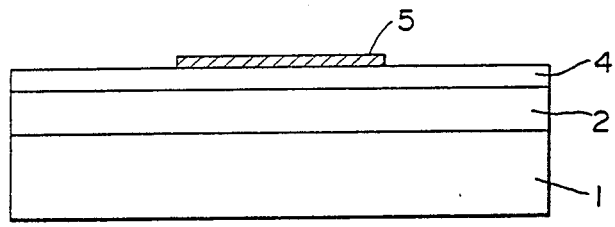
Figure 13B:
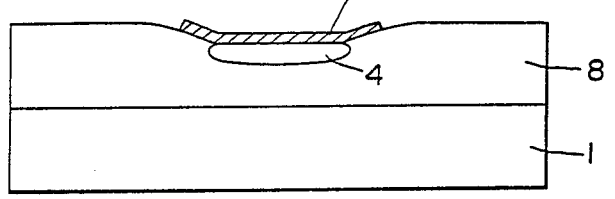

FIGS. 8(A) through 8(D) are explanatory of the first method of forming a pattern. A substrate 1 shown in FIGS. 8(A) through 8(D) is the sam as the substrate shown in FIGS. 13(A) and 13(B).

Figure 8:
FIGS. 8(A) through 8(D) are views explaining a method of forming a pattern according to an embodiment of the present invention.
Figure 8:
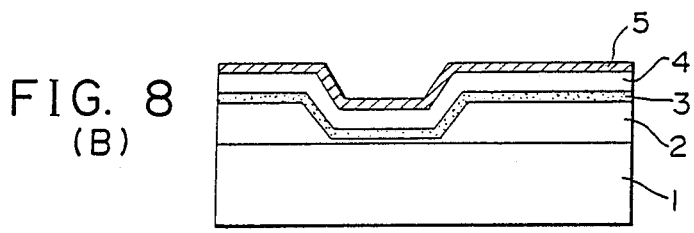
Figure 8:
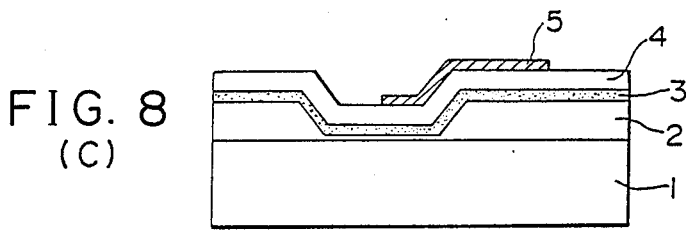
Figure 8:
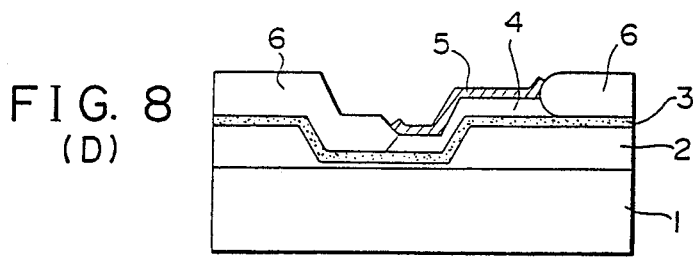

As illustrated in FIG. 8(A), a silicon oxide film serving as a base is formed as an oxide film 2 on the substrate 1. In the illustrated embodiment, the oxide film 2 is shaped in a two-dimensional pattern as a relief represented by thickness variations thereof.

Then, a nitrided silicon film is formed on the oxide film 2 as an oxidant diffusion prevention film 3 having a thickness of 100 Å or more, as shown in FIG. 8(B).

Thereafter, a film 4 such as a film of amorphous silicon, polycrystalline silicon, or the like, or a film of silicide such as Ti-Si, Al-Si, Mo-Si, W-Si, or the like, or a multilayer film composed of such a silicon film and such a silicide film, is deposited on the oxidant diffusion prevention film 3, and then a mask layer 5 of nitrided silicon or the like is formed on the film 4.

Then, the mask layer 5 is shaped to a desired mask layer by a patterning process including photolithography and dry etching or the like, as shown in FIG. 8(C).

The film 4 is thereafter selectively oxidized to produce a desired pattern which is separated by an oxidized portion 6 of the film 4.

Even when additional oxidation is continued for providing an oxidizing margin after the film 4 has fully been oxidized across its thickness to pattern the same, the oxidant diffusion prevention film 3 is effective in preventing oxidants such as oxygen, water molecules, and the like from being diffused, so that the film 4 covered with the mask layer 5 will not be oxidized.

Figure 9:
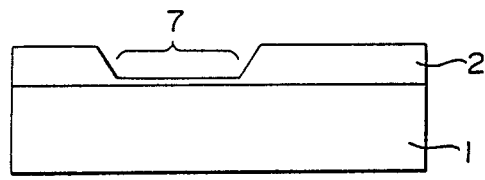
FIGS. 9(A) through 9(D) are views explaining a method of forming a pattern according to another embodiment of the present invention.
Figure 9:
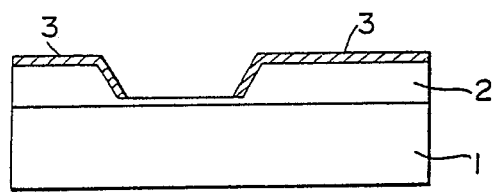
Figure 9:
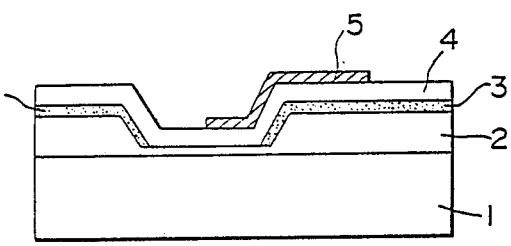
Figure 9:
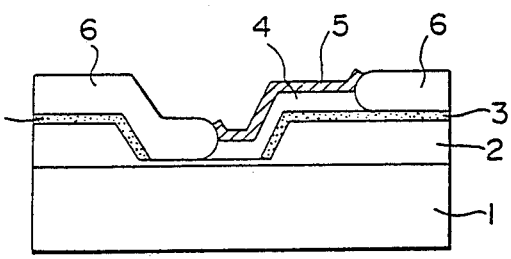

FIGS. 9(A) through 9(D) show another embodiment of the first method of forming a pattern. The structure shown in FIG. 9(A) is the same as the structure illustrated in FIG. 8(A). As shown in FIG. 9(B), after an oxidant diffusion prevention film 3 has been formed on an oxide film 2 by a silicon nitride film, a portion of the the oxidant diffusion prevention film 3 is removed from a thinner portion 7 of the oxide film 2.

Then, a film 4 such as a silicon film, a silicide film, or a multilayer film composed of silicon and silicide films, and a mask layer 5 are formed, the mask layer 5 being patterned to a desired mask shape, as shown in FIG. 9(C).

The film 4 is selectively oxidized to produce a pattern separated by an oxidized portion 6 of the film 4 as shown in FIG. 9(D).

In this embodiment, oxidants are prevented from being transferred on the thicker portion of the oxide film 2 by the oxidant diffusion prevention film 3, and oxidants are also prevented from being transferred on the thinner portion 7 of the oxide film 2 because the thickness of the oxide film 2 is small.

According to this embodiment, the oxide film 2 and the film 4 can be brought into direct contact with each other through the thinner portion of the oxide film 2. Therefore, this embodiment is highly effective when the thinner portion 7 of the oxide film 2 is to be used as the gate oxide film of a MOS-FET.

Figure 10:
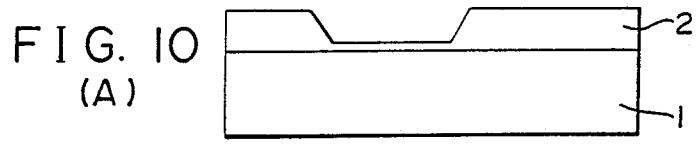
FIGS. 10(A) through 10(E) are views explaining a method of forming a pattern according to still another embodiment of the present invention.
Figure 10:
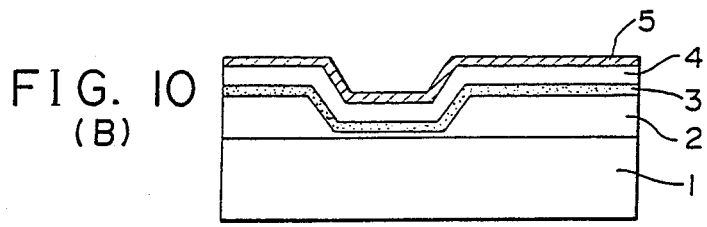
Figure 10:
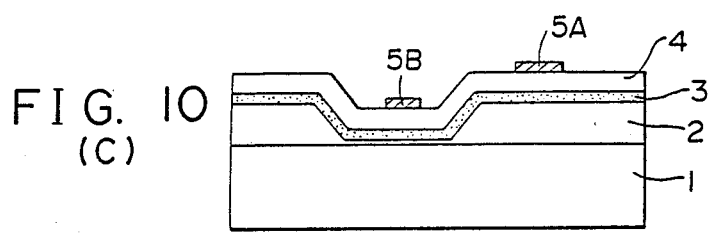
Figure 10:
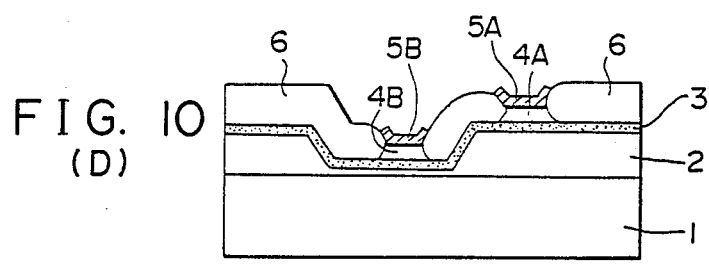
Figure 10:
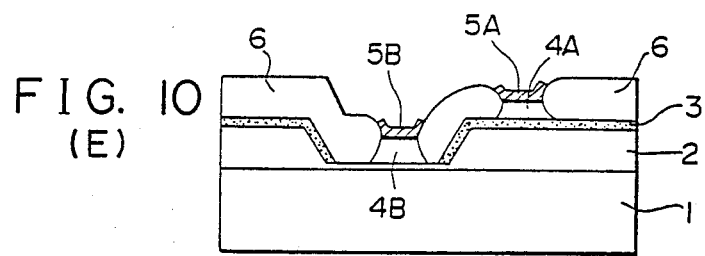

FIGS. 10(A) through 10(D) are illustrative of an embodiment of the second method of forming a pattern. The structures of FIGS. 10(A) and 10(B) are the same as those shown in FIGS. 8(A) and 8(B). According to this embodiment, as shown in FIG. 10(C), a mask layer 5 is patterned to a desired mask pattern having mask layer portions 5A, 5B positioned on thicker and thinner portions, respectively, of an oxide film 2. Then, a film 4 such a silicon film, a silicide film, or a multilayer film composed of silicon and silicide films is selectively oxidized to leave portions 4A, 4B under the respective mask portions 5A, 5B, the portions 4A, 4B being of substantially the same shape as that of the mask portions 5A, 5B.

FIG. 10(E) shows a modification of the embodiment illustrated in FIGS. 10(A) through 10(D). The modification of FIG. 10(E) is similar to the embodiment of FIGS. 10(A) through 10(D) except that an oxidant diffusion prevention film 3 is removed from the thinner portion of the oxide film 2, as with the embodiment shown in FIGS. 9(A) through 9(D).

FIGS. 11(A) through 11(G) illustrate an embodiment of the third method of forming a pattern. In this embodiment, a method of forming a modified layer, as described above, is employed to form a silicon nitride film as an oxidant diffusion prevention film on a base oxide film in self alignment therewith.

The structures shown in FIGS. 11(A) and 11(B) are the same as those shown in FIGS. 7(A) and 7(B). More specifically, on a silicon substrate 10 having a silicon surface as shown in FIG. 11(A), there are formed a relatively thin silicon oxide film 20, a silicon film 30 of polycrystalline silicon or the like, and a silicon nitride film 40. The silicon nitride film 40 is first uniformly formed on the silicon film 30 over its entire surface, and then patterned as a negative pattern of a desired two-dimensional shape by photolithography. At this time, the silicon film 30 and the silicon oxide film 20 may also be shaped in the same pattern as the silicon nitride film 40.

Then, the structure is oxidized while the silicon nitride film 40 is being used as a mask. The portion of the silicon film 30 which is not covered with the mask layer 40 is oxidized and united with the lower silicon oxide film 20, and a portion of the silicon surface of the silicon substrate 10 is also oxidized into silicon oxide. These oxidized portions grow into a silicon oxide film 50 as shown in FIG. 11(B).

Subsequently, the mask of silicon nitride film 40 is removed to produce the desired two-dimensional pattern represented by thickness variations of the silicon oxide film 50, with an area free of the two-dimensional pattern being covered with the silicon film 30.

Then, the structure is directly nitrided to form a modified layer including a thicker portion 15A on the silicon oxide film 50 and a thinner portion 15B on the silicon film 30, as shown in FIG. 11(C). Thereafter, only the thinner portion 15B of the modified layer is removed while leaving the thicker portion 15A thereof thereby fabricating a structure in which the thicker modified layer portion 15A is self-aligned as an oxidant diffusion prevention film on the silicon oxide film 50, as shown in FIG. 11(D). The silicon film 30 and the relatively thin silicon oxide film 20 therebelow may of course be removed if necessary. The silicon surface below the relatively thin silicon oxide film 20 is protected by the relatively thin silicon oxide film 20 and the silicon film 30 against formation of defects therein.

The silicon film 30 is removed or the silicon film 30 and the relatively thin silicon oxide film 20 therebelow are removed, and then the entire substrate is oxidized again to form a silicon oxide film on the rest except the two-dimensional pattern and also a thin oxide film 70 on the modified layer portion 15A. The oxide film 70 is of a thickness which is smaller than the thickness of an oxide film that will be formed by oxidizing a silicon film, a silicide film, or a multilayer film composed of silicon and silicide films in a marginal oxidizing process, or which is substantially equal to or smaller than the relatively thin silicon oxide film 20. Since the oxide film 70 is thin, the combined multilayer film composed of the modified layer portion 15A as the oxidant diffusion prevention film and the thin oxide film 70 allows a film 4 such as a silicon film, a silicide film, or a multilayer film composed of silicon and silicide films to be patterned in a manner similar to that on the relatively thin silicon oxide film 20 even on the thicker oxide film 50.

Then, as shown in FIG. 11(F), the film 4 and a mask layer 5 are formed, and the mask layer 5 is patterned to a desired shape. Thereafter, the film 4 is selectively oxidized to produce a pattern separated by oxidized portions 6 of the film 4, as shown in FIG. 11(G).

In this embodiment, oxidants are prevented from being transferred in the oxide film 50 by the oxidant diffusion prevention film 15A, and the transfer of oxidants are limited in the silicon oxide film 20 since the film 20 is relatively thin. Therefore, the film 4 can be left below the mask layer 5 in substantially the same shape and almost the same size as the mask layer 5 on both the oxide film 50 and the silicon oxide film 20. This embodiment is also highly effective when the silicon oxide film 20 is to be used as the gate oxide film of a MOS-FET.

While the oxidant diffusion prevention film comprises the silicon nitride film in the above embodiments, it may instead be formed of $SiH_4$ and $NH_3$, $SiH_2Cl_2$ and $NH_3$, or the like, and deposited on the oxide film by CVD employing thermal energy, light energy, plasma, or the like. Alternatively, the oxidant diffusion prevention film may be formed by implanting nitrogen ions into a silicon film which is deposited by CVD, or directly nitriding such a silicon film with thermal energy or plasma in a nitrogen or ammonium atmosphere. Instead of depositing a silicon nitride film on an oxide film, the surface of an oxide film may be directly nitrided in the same manner as described above to form an oxinitride film which can be used as an oxidant diffusion prevention film. The oxide film referred to above may be a silicon oxide film or an aluminum oxide film. A thin oxide film may be formed (deposited or grown) on the oxidant diffusion prevention film as described above.

In each of the above embodiments, the mask layer 5 may comprise a composite layer of an oxide film and a silicon nitride film formed thereon, as well as a silicon nitride film alone.

Prior to the patterning process based on selective oxidation, the surface of the silicon film, the silicide film, or the multilayer film of these silicon and silicide films may be etched to a necessary depth as required.

According the foregoing methods of forming a pattern, the silicon film, the silicide film, or the multilayer film can be patterned in substantially the same shape and almost the same size as the mask layer, and can be patterned simultaneously on the thicker and thinner portions of the oxide film beneath the silicon film, the silicide film, or the multilayer film. Therefore, the silicon film, the silicide film, or the multilayer film shaped to a fine pattern shape can reliably be obtained while being sandwiched by the oxide film. Therefore, the surface of the silicon semiconductor device structure is made of a smooth cross section and a fine wiring pattern can be achieved highly reliably thereon.

Although certain preferred embodiments have been shown and described, it should be understood that many changes and modifications may be made therein without departing from the scope of the appended claims.

What is claimed is:

1. A method of forming a modified layer in a silicon semiconductor device structure, comprising:
    forming a two-dimensional pattern of a silicon oxide film on a silicon surface of a substrate, thereby to form a material, said two-dimensional pattern being represented by the presence and absence of the silicon oxide film;
    nitriding at least a side of said material with said silicon oxide film thereon to form a modified layer on the silicon oxide film and the silicon surface of said substrate, said modified layer including a thicker portion on said silicon oxide film and a thinner portion on said silicon surface of said substrate; and
    removing said thinner portion of the modified layer from said silicon surface while leaving said thicker portion of the modified layer on said silicon oxide film, for thereby forming the modified layer on said silicon oxide film substantially in the same shape as said silicon oxide film.

2. A method of forming a modified layer in a silicon semiconductor device structure, comprising:
    forming a two-dimensional pattern of a silicon oxide film on a silicon surface of a substrate, thereby to form a material, said two-dimensional pattern being represented by thickness variations of the silicon oxide film;
    nitriding at least a side of said material with said silicon oxide film thereon to form a modified layer on thicker and thinner portions of the silicon oxide film, said modified layer including a thicker portion on the thicker portion of said silicon oxide film and a thinner portion on the thinner portion of said silicon oxide film; and
    removing said thinner portion of the modified layer from said thinner portion of the silicon oxide film while leaving said thicker portion of the modified layer on said thicker portion of the silicon oxide film, for thereby forming the modified layer on said silicon oxide film substantially in the same shape as said silicon oxide film.

3. A method of forming a modified layer in a silicon semiconductor device structure, comprising:
    forming a two-dimensional pattern of a silicon oxide film on a silicon surface of a substrate, thereby to form a material, said two-dimensional pattern being represented by the presence and absence, and/or thickness variations of the silicon oxide film;
    nitriding at least a side of said material with said silicon oxide film thereon to form a modified layer on the silicon oxide film or a thicker portion of said silicon oxide film and the silicon surface of said substrate or a thinner portion of the silicon oxide film, said modified layer including a thicker portion on said silicon oxide film or the thicker portion of the silicon oxide film and a thinner portion on said silicon surface of said substrate or the thinner portion of the silicon oxide film;

removing said thinner portion of the modified layer from said silicon surface or said thinner portion of the silicon oxide film while leaving said thicker portion of the modified layer on said silicon oxide film or said thicker portion of the silicon oxide film, for thereby forming the modified layer on said silicon oxide film substantially in the same shape as said silicon oxide film;

oxidizing at least said side to form a silicon oxide film on the exposed silicon surface; and thereafter selectively removing said silicon oxide film.

4. A method of forming a modified layer in a silicon semiconductor device structure, comprising:

depositing a silicon film on a material having a two-dimensional pattern of a silicon oxide film formed on a silicon surface of a substrate, said two-dimensional pattern being represented by thickness variations of the silicon oxide film;

patterning said silicon film to remove the same at least on a thicker portion of said silicon oxide film;

selectively etching away an exposed portion of said thinner portion of the silicon oxide film which is not covered with said silicon film;

nitriding at least a side of said material with said silicon oxide film thereon to form a modified layer on said silicon oxide film, said silicon surface of the substrate, and a surface of said deposited and patterned silicon film, said modified layer including a thicker portion on said silicon oxide film and a thinner portion on said silicon surface and said deposited and patterned silicon film; and removing said thinner portion of the modified layer from said silicon surface while leaving said thicker portion of the modified layer on said silicon oxide film, for thereby forming the modified layer on said silicon oxide film substantially in the same shape as said silicon oxide film.

5. A method of forming a modified layer in a silicon semiconductor device structure, comprising:

depositing a silicon film on a material including a two-dimensional pattern of a silicon oxide film formed on a silicon surface of a substrate, said two-dimensional pattern being represented by thickness variations of the silicon oxide film;

patterning said silicon film to remove the same at least on a thicker portion of the silicon oxide film;

nitriding at least a side of said material with said silicon oxide film thereon to form a modified layer on the silicon oxide film and a surface of said silicon film, said modified layer including a thicker portion on said silicon oxide film and a thinner portion on the surface of said silicon film; and removing said thinner portion of the modified layer from said surface of the silicon film while leaving said thicker portion of the modified layer on said silicon oxide film, for thereby forming the modified layer on said silicon oxide film substantially in the same shape a said silicon oxide film.

6. A method of forming a modified layer in a silicon semiconductor device structure, comprising:

forming a relatively thin silicon oxide film on a silicon surface of a substrate;

forming a silicon film on said relatively thin silicon oxide film;

forming a mask layer on said silicon film in a negative pattern of a two-dimensional pattern;

oxidizing said silicon film except an area corresponding to a portion or portions of said mask layer to form a relatively thick silicon oxide film;

thereafter removing said mask layer;

then nitriding said silicon film and said silicon oxide film to form a modified layer including a thicker portion on said silicon oxide film and a thinner portion on said silicon film; and removing said thinner portion of the modified layer while leaving said thicker portion of the modified layer.

7. A method of forming a pattern, comprising:

forming an oxide film on a substrate, said oxide film having thicker and thinner portions;

forming an oxidant diffusion prevention film at least on said thicker portion of said oxide film;

depositing a silicon film, a silicide film, or a multilayer film composed of silicon and silicide films on a surface of said substrate with said oxide film and said oxidant diffusion prevention film;

forming a mask layer of a desired shape on said silicon film, said silicide film, or said multilayer film; and oxidizing said silicon film, said silicide film, or said multilayer film to pattern the same in a shape corresponding to said mask layer.

8. A method of forming a pattern, comprising:

forming an oxide film on a substrate, said oxide film having thicker and thinner portions;

forming an oxidant diffusion prevention film at least on said thicker portion of said oxide film;

depositing a silicon film, a silicide film, or a multilayer film composed of silicon and silicide films on a surface of said substrate with said oxide film and said oxidant diffusion prevention film;

forming a mask layer of a desired shape on said silicon film, said silicide film, or said multilayer film; and oxidizing said silicon film, said silicide film, or said multilayer film to pattern the same in a shape corresponding to said mask layer simultaneously on said thicker and thinner portions of the oxide film.

9. A method according to claim 7 or 8, further comprising the step of forming a relatively thin oxide film on said oxidant diffusion prevention film.

* * * * *